(12) United States Patent
Ekman et al.

(10) Patent No.: US 10,649,031 B2
(45) Date of Patent: May 12, 2020

(54) HARDWARE ASSISTED HIGH SPEED SERIAL TRANSCEIVER TESTING

(71) Applicant: International Business Machines Corporation, Armonk, NY (US)

(72) Inventors: Jeremy T. Ekman, West Concord, MN (US); Donald J. Ziebarth, Rochester, MN (US); George R. Zettles, IV, Rochester, MN (US); Trevor J. Timpane, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 15/874,287

(22) Filed: Jan. 18, 2018

(65) Prior Publication Data

US 2019/0219636 A1 Jul. 18, 2019

(51) Int. Cl.
*G01R 31/3183* (2006.01)
*G06F 11/26* (2006.01)
(Continued)

(52) U.S. Cl.
CPC .... *G01R 31/318385* (2013.01); *G06F 11/221* (2013.01); *G06F 11/261* (2013.01); *H04L 1/00* (2013.01); *G01R 31/31703* (2013.01); *G06F 13/10* (2013.01); *G06F 13/385* (2013.01); *H04L 1/18* (2013.01); *H04L 43/50* (2013.01); *H04L 69/324* (2013.01)

(58) Field of Classification Search
CPC ...... G01R 31/318385; G01R 31/31703; G06F 11/221; G06F 11/261; G06F 13/10; G06F 13/385; H04L 69/324; H04L 1/18; H04L 43/50; H04L 1/00
See application file for complete search history.

(56) References Cited

U.S. PATENT DOCUMENTS 4,740,972 A * 4/1988 Rutherford, Jr. ......... B61L 1/20
714/807
8,782,477 B2 7/2014 Klein et al.
(Continued)

OTHER PUBLICATIONS

LeCroy Corporation, *Sierra M6-1 SAS/SATA Protocol Analyzer*, User Manual, LeCroy Protocol Solutions Group, dated Aug. 2011, Part 1 (pp. 1-100).
(Continued)

*Primary Examiner* — April Y Blair
*Assistant Examiner* — Sazzad Hossain
(74) *Attorney, Agent, or Firm* — Nathan M. Rau

(57) ABSTRACT

Hardware assisted high speed serial (HSS) transceiver testing including receiving, by a link layer hardware state machine on a HSS transmitting device, an instruction to generate a test pattern, wherein the test pattern comprises a sequence of data units; loading, by the link layer hardware state machine, each unique data unit into embedded random access memory (RAM); generating, by the link layer hardware state machine, the test pattern comprising the sequence of data units using the unique data units stored in the embedded RAM, wherein at least one of the unique data units is repeated in the sequence of data units of the test pattern; and sending, by the link layer hardware state machine, the generated test pattern to an input of a HSS transceiver.

20 Claims, 4 Drawing Sheets

(51) Int. Cl.
 G06F 11/22 (2006.01)
 H04L 1/00 (2006.01)
 G06F 13/38 (2006.01)
 G06F 13/10 (2006.01)
 H04L 1/18 (2006.01)
 H04L 29/08 (2006.01)
 G01R 31/317 (2006.01)
 H04L 12/26 (2006.01)

(56) References Cited

U.S. PATENT DOCUMENTS

| | | | |
|---|---|---|---|
| 8,943,233 B1 | 1/2015 | Mark et al. | |
| 9,037,910 B2 | 5/2015 | Myrah et al. | |
| 2003/0099139 A1* | 5/2003 | Abrosimov | G11C 29/56 365/200 |
| 2005/0007170 A1* | 1/2005 | Nakahara | G11C 7/1075 327/199 |
| 2010/0313089 A1* | 12/2010 | Rajski | G01R 31/318547 714/731 |
| 2014/0032967 A1* | 1/2014 | Myrah | G06F 11/221 714/32 |

OTHER PUBLICATIONS

LeCroy Corporation, *Sierra M6-1 SAS/SATA Protocol Analyzer*, User Manual, LeCroy Protocol Solutions Group, dated Aug. 2011, Part 2 (pp. 101-185).

LeCroy Corporation, *Sierra M6-1 SAS/SATA Protocol Analyzer*, User Manual, LeCroy Protocol Solutions Group, dated Aug. 2011, Part 3 (pp. 186-300).

IBM, *Apparatus and Method for Optimizing Electrical Stress Testing of SAS High Speed Interfaces*, An IP.com Prior Art Database Technical Disclosure, IP.com No. IPCOM000167122D, Original Publication Date: Jan. 30, 2008, 6 pages.

IBM, *Method and System of Delivering EPOW Notifications to Serial Attached Drives*, An IP.com Prior Art Database Technical Disclosure, IP.com No. IPCOM000160285D, Original Publication Date: Nov. 9, 2007, 3 pages.

Anonymous, *Method for standardized IP-based serial-attached SCSI storage networking for linking ATCA data storage blades*, An IP.com Prior Art Database Technical Disclosure, IP.com No. IPCOM000317506D, IP.com Electronic Publication Date: Jun. 21, 2006, 5 pages.

* cited by examiner

HARDWARE ASSISTED HIGH SPEED SERIAL TRANSCEIVER TESTING

BACKGROUND

Field of the Invention

The field of the invention is data processing, or, more specifically, methods, apparatus, and products for hardware assisted high speed serial transceiver testing.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for hardware assisted high speed serial (HSS) transceiver testing are disclosed in this specification. Hardware assisted HSS transceiver testing includes receiving, by a link layer hardware state machine on a HSS transmitting device, an instruction to generate a test pattern, wherein the test pattern comprises a sequence of data units; loading, by the link layer hardware state machine, each unique data unit of the test pattern into embedded random access memory (RAM); generating, by the link layer hardware state machine, the test pattern comprising the sequence of data units using the unique data units stored in the embedded RAM, wherein at least one of the unique data units is repeated in the sequence of data units of the test pattern; and sending, by the link layer hardware state machine, the generated test pattern to an input of a HSS transceiver, wherein an output of the HSS transceiver is tested by comparing the output test pattern of the HSS transceiver to an expected output test pattern.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
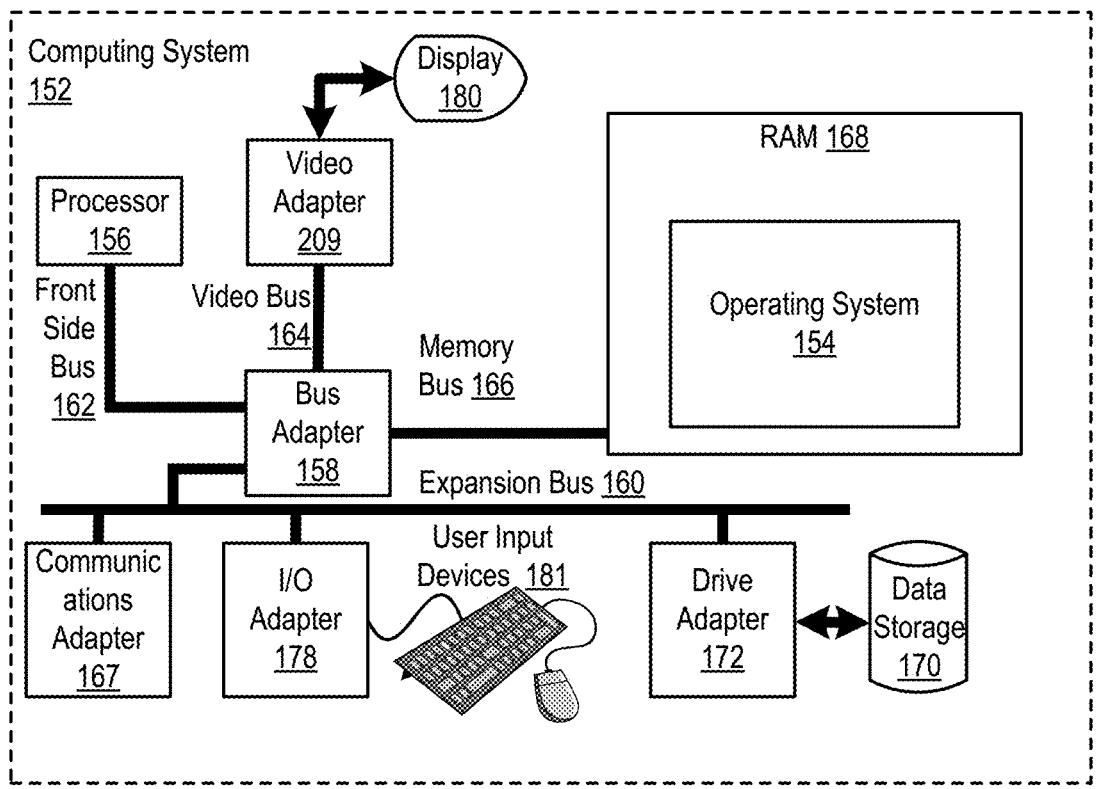
FIG. 1 sets forth a block diagram of an example system configured for hardware assisted high speed serial (HSS) transceiver testing according to embodiments of the present invention.

Exemplary methods, apparatus, and products for hardware assisted high speed serial (HSS) transceiver testing in accordance with the present invention are described with reference to the accompanying drawings, beginning with FIG. 1. FIG. 1 sets forth a block diagram of automated computing machinery comprising an exemplary computing system (152) configured for hardware assisted HSS transceiver testing according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for hardware assisted HSS transceiver testing according to embodiments of the present invention include UNIX™, Linux™, Microsoft Windows™ AIX™ IBM's iOS™, and others as will occur to those of skill in the art. The operating system (154) in the example of FIG. 1 is shown in RAM (168), but many components of such software typically are stored in non-volatile memory also, such as, for example, on a disk drive (170).

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for hardware assisted HSS transceiver testing according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for hardware assisted HSS transceiver testing according to embodiments of the present invention include modems for wired dial-up communications, Ethernet (IEEE 802.3) adapters for wired data communications, and 802.11 adapters for wireless data communications.

Figure 2:
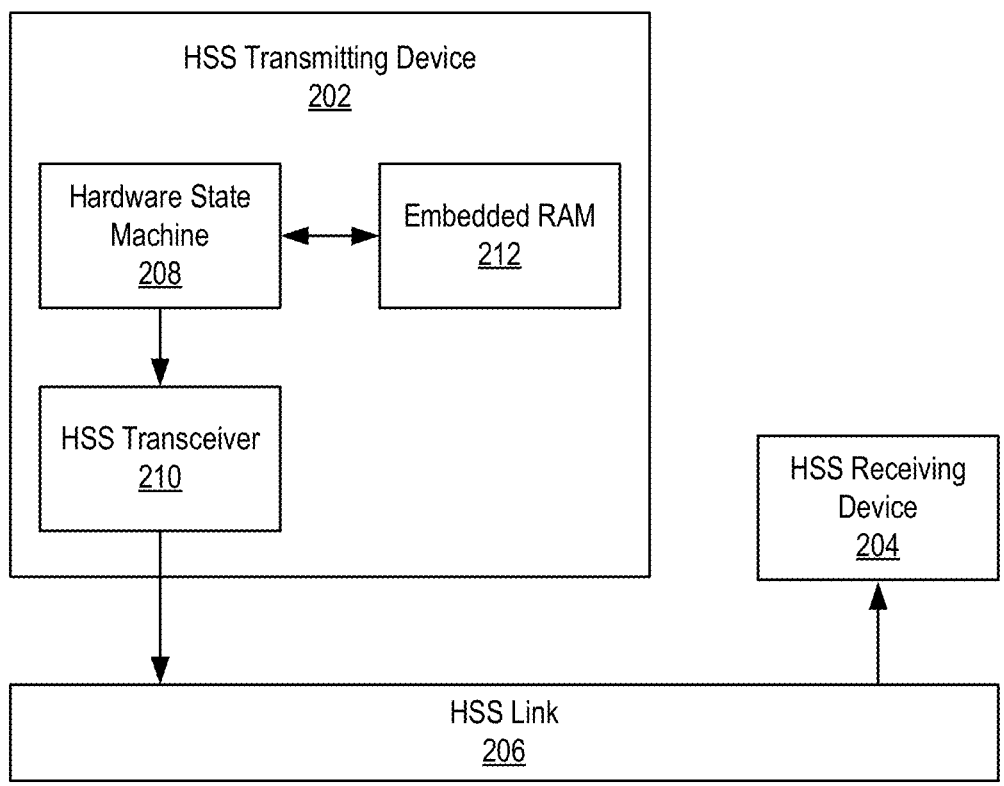
FIG. 2 sets forth a block diagram of an example system configured for hardware assisted HSS transceiver testing according to embodiments of the present invention.

FIG. 2 shows an exemplary system for hardware assisted high speed serial (HSS) transceiver testing according to embodiments of the present invention. As shown in FIG. 2, the exemplary system includes a high speed serial (HSS) transmitter (202) coupled to a HSS receiving device (204) via a HSS link (206). The HSS transmitting device (202) includes a link layer hardware state machine (208), a HSS transceiver (210), and embedded RAM (212).

The HSS transmitting device (202) is a collection of hardware that connects the HSS transceiver (210) to an output signal line, such as the HSS link (206). The HSS transmitting device (202) may be an endpoint on a HSS link (206), such as, for example, a serial attached small computer systems interface (SCSI) device, a serial advanced technology attachment (SATA) device, a peripheral component interface (PCI) device, an Ethernet device, or a fiberchannel device.

The HSS transceiver (210) is a physical layer hardware device that prepares data (e.g., a test pattern from the link layer hardware state machine (208)) for transmission on the HSS link (206). The data preparation performed by the HSS transceiver (210) may include serializing the data for transmission on the HSS link (206). The HSS transceiver (210) may be, for example, a serial attached SCSI (SAS) transceiver, a SATA transceiver, a PCI transceiver, Ethernet transceiver, or fiberchannel transceiver. The HSS transceiver (210) may be a hardware component of an integrated circuit.

The HSS transceiver (210) operates at the physical layer of the open systems interconnection (OSI) model. Specifically, the HSS transceiver (210) may operate at the physical layer of a high-speed serial protocol, such as, for example, SAS, SATA, PCI, Ethernet protocol, or fiberchannel protocol.

The link layer hardware state machine (208) is hardware logic that generates a test pattern and sends the test pattern to the HSS transceiver (210). The link layer hardware state machine (208) performs tasks based on the current state of the link layer hardware state machine (208). The link layer hardware state machine (208) operates at the link layer of the OSI model. Specifically, the link layer hardware state machine (208) may operate at the link layer of a high-speed serial protocol, such as, for example, SAS, SATA, PCI, Ethernet protocol, or fiberchannel protocol. The link layer hardware state machine (208) may be a hardware component of an integrated circuit.

The link layer hardware state machine (208) generates and sends test patterns directly to the HSS transceiver (210), without utilizing software or firmware. Using software or firmware to generate and send the test patterns to the HSS transceiver (210) may require a greater amount of time to generate and send than using a link layer hardware state machine (208). Further, basic functionality of the HSS transceiver (210) may interfere with the ability of software or firmware to generate and send some test patterns, such as custom test patterns. For example, an HSS transceiver (210) may include undesired data (e.g., buffer data from a previous transmission) in a test pattern received from firmware or software.

By interacting directly with the HSS transceiver (210) at the link layer, the link layer hardware state machine (208) can bypass or override functionality of the HSS transceiver (210) in order to generate and send a custom test pattern. Additionally, the link layer hardware state machine (208) may use hardware responsible for basic transceiver functionality to generate and send test patterns. For example, the link layer hardware state machine (208) may use hardware, such as embedded RAM, responsible for sending handshake data that identifies basic information about the HSS transceiver (210) from the HSS transceiver (210) to the HSS link (206). Such handshake data RAM is embedded RAM designed primarily or exclusively for sending handshake data. Handshake data is data used to establish a connection to another entity on the HSS link (206), and may include identifying information about the sender, such as the address of the HSS transceiver (210). Within the SAS context, handshake data RAM may include identify address frame RAM. The link layer hardware state machine (208) may also utilize pre-existing data-flow paths and scrambling circuits in order to generate and send test patterns to the HSS transceiver (210).

The link layer hardware state machine (208) may include other hardware elements to aid in sending test patterns. For example, the link layer hardware state machine (208) may include a counter and comparator to detect that the appropriate number of data units have been added to the sequence of data units in the test pattern. The link layer hardware state machine (208) may also include logic gates to enable different modes, such as sending different test patterns to the HSS transceiver (210).

The embedded RAM (212) is hardware memory on the HSS transmitting device (202). The embedded RAM (212) may be embedded in that the embedded RAM (212) is a hardware component of an integrated circuit upon which the HSS transceiver (210) and/or the link layer hardware state machine (208) also reside. The two or more of the link layer hardware state machine (208), the HSS transceiver (210), and the embedded RAM (212) may be on the same integrated circuit, such as a field programmable gate array (FPGA) or application specific integrated circuit (ASIC).

The embedded RAM (212) may be hardware used for basic transceiver functionality, such as storing and sending handshake data. Such embedded RAM is referred to as handshake data RAM. The embedded RAM (212) may be appropriated by the link layer hardware state machine (208) from the embedded RAM's primary use (e.g., for sending handshake data), and instead be used to send test patterns. The embedded RAM (212) may be smaller than higher-level RAM. For example, the embedded RAM (212) may be configured to hold eight dwords for transmission and eight dwords received. The same smaller amount of memory in the embedded RAM (212) may be used by the link layer hardware state machine (208) to generate and send test patterns.

The HSS link (206) is a communications bus capable of transferring a data stream serially from the HSS transmitting device (202) to the HSS receiving device (204). The HSS link (206) may be, for example, a SAS bus, a SATA bus, a PCI bus, Ethernet bus, or fiberchannel bus.

The HSS receiving device (204) is a device capable of receiving the test pattern from the transmitting device (202) via the HSS transceiver (210). The receiving device (204) may be an endpoint on a HSS link (206), such as, for example, a SAS device, a SATA device, or a PCI device. The receiving device (204) may be a testing device, such as an oscilloscope or other measuring device.

Figure 3:
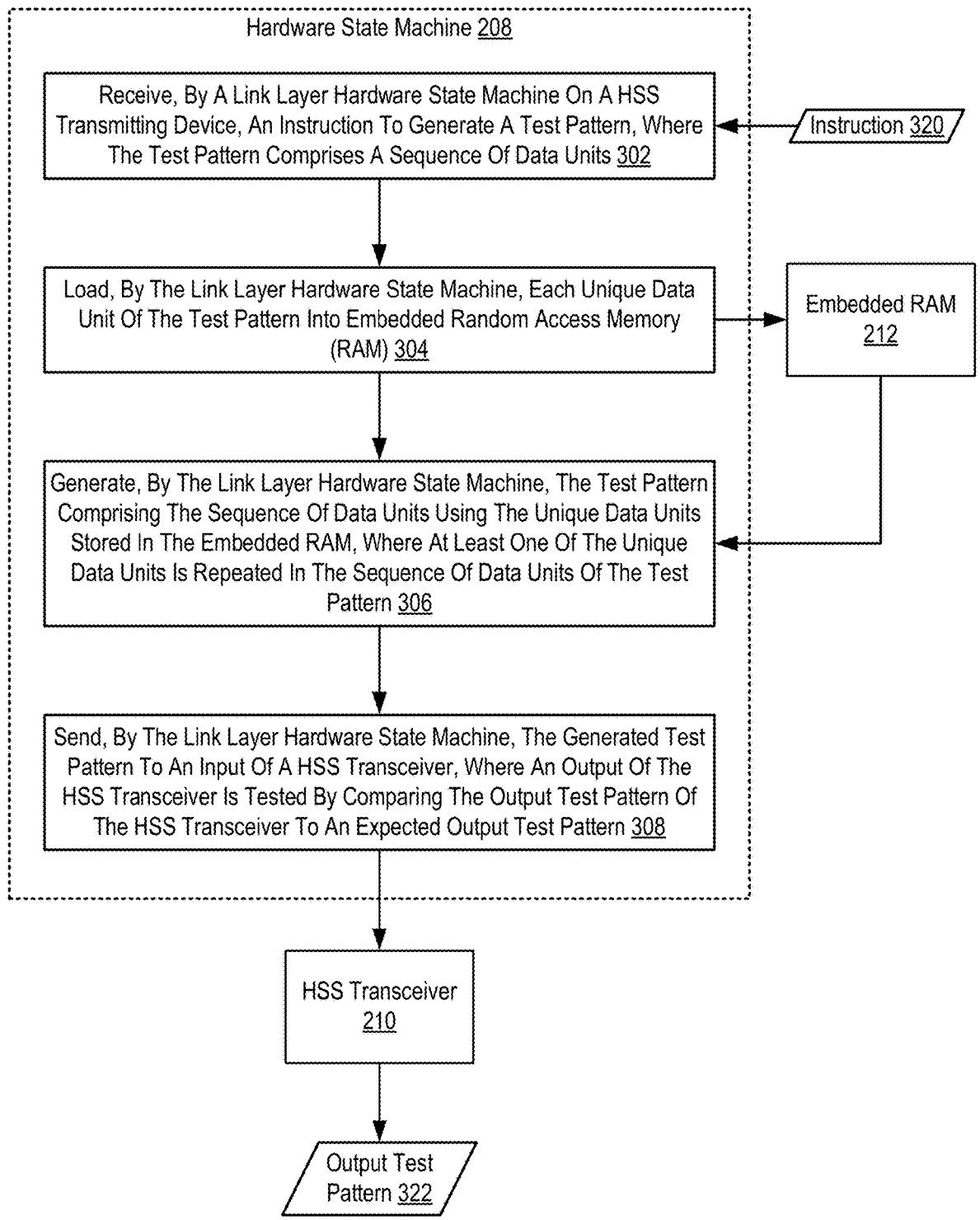
FIG. 3 sets forth a flow chart illustrating an exemplary method for hardware assisted HSS transceiver testing according to embodiments of the present invention.

For further explanation, FIG. 3 sets forth a flow chart illustrating an exemplary method for hardware assisted high speed serial (HSS) transceiver testing according to embodiments of the present invention that includes receiving (302), by a link layer hardware state machine (208) on a HSS transmitting device, an instruction (320) to generate a test pattern, wherein the test pattern comprises a sequence of data units. Receiving (302), by a link layer hardware state machine (208) on a HSS transmitting device, an instruction (320) to generate a test pattern, wherein the test pattern comprises a sequence of data units may be carried out by detecting that a register on the integrated circuit has been written, indicating the test pattern generation is to begin. The register may be on an integrated circuit shared by the link layer hardware state machine (208). Receiving (302), by a link layer hardware state machine (208) on a HSS transmitting device, an instruction (320) to generate a test pattern, wherein the test pattern comprises a sequence of data units may also be carried out by detecting a signal sent to the link layer hardware state machine (208) indicating the test pattern generation is to begin.

A test pattern is a sequence of data units. The test pattern includes a number of unique data units, some of which may be repeated in the sequence of data units. Consequently, the sequence of data units includes a number of unique data units that is less than the total number of data units in the sequence of data units. For example, a test pattern may be the following sequence of data units: data_unit_A, data_unit_B, data_unit_C, data_unit_A, data_unit_A. The example test pattern is a sequence of data units that includes five data units and three unique data units (data_unit_A, data_unit_B, and data_unit_C).

The instruction to generate the test pattern may also include a test pattern identifier identifying the test pattern. Specifically, an additional signal or additional register may include an identifier that is mapped, by the link layer hardware state machine (208), to a specific test pattern. The link layer hardware state machine (208) may then access instructions or configurations associated with the test pattern identified by the test pattern identifier.

Alternatively, the link layer hardware state machine (208) may automatically select a test pattern. The test pattern may be automatically selected based on information about the HSS transceiver (210) acquired by the link layer hardware state machine (208). Such information may include, for example, previously sent test patterns and type of HSS transceiver (210).

The method of FIG. 3 further includes loading (304), by the link layer hardware state machine (208), each unique data unit of the test pattern into embedded random access memory (RAM) (212). Loading (304), by the link layer hardware state machine (208), each unique data unit of the test pattern into embedded random access memory (RAM) (212) may be carried out by initiating the transfer of the unique data units in the embedded RAM (212). The transfer may be completed by hardware logic associated with the embedded RAM (212). The unique data units may be loaded from other locations on the integrated circuit, such as a persistent memory storage location or hardcoded memory. Only the unique data units may be stored in embedded RAM without storing the entire sequence of data units. Further, the entire sequence of data units may not exist in storage on the integrated circuit; rather, only the unique data units are stored on the integrated circuit.

The method of FIG. 3 further includes generating (306), by the link layer hardware state machine (208), the test pattern comprising the sequence of data units using the unique data units stored in the embedded RAM (212), wherein at least one of the unique data units is repeated in the sequence of data units of the test pattern. Generating (306), by the link layer hardware state machine (208), the test pattern comprising the sequence of data units using the unique data units stored in the embedded RAM (212), wherein at least one of the unique data units is repeated in the sequence of data units of the test pattern may be carried out by the link layer hardware state machine (208) initiating a transfer, to the HSS transceiver (210), of the data units in the sequence of data units in the appropriate order.

The unique data units are repeated in the sequence of data units in that each unique data unit is transferred and added to the sequence of data units a number of times based on the requirements of the test pattern. For example, a test pattern may include the following sequence of data units: data_unit_A, data_unit_B, data_unit_C, data_unit_A, data_unit_A. In this example, data_unit_A is repeated three times. The repeated unique data units are not necessarily consecutively generated and sent.

Because only the unique data units are stored in embedded RAM, the total size of the generated test pattern is greater than the combined size of the unique data units stored in the embedded RAM. For example, test pattern "data_unit_A, data_unit_B, data_unit_C, data_unit_A, data_unit_A" only requires storage in the embedded RAM for data_unit_A, data_unit_B, data_unit_C. The sequence of data units is generated by adding data_unit_A three times in the test pattern.

The method of FIG. 3 further includes sending (308), by the link layer hardware state machine (208), the generated test pattern to an input of a HSS transceiver (210), wherein an output of the HSS transceiver (210) is tested by comparing the output test pattern (322) of the HSS transceiver (210) to an expected output test pattern. Sending (308), by the link layer hardware state machine (208), the generated test pattern to an input of a HSS transceiver (210), wherein an output of the HSS transceiver (210) is tested by comparing the output test pattern (322) of the HSS transceiver (210) to an expected output test pattern may be carried out by the link layer hardware state machine (208) initiating the transfer of each data unit in the sequence of data units to an input line of the HSS transceiver (210).

The output of the HSS transceiver (210) may be tested by a testing device, such as an oscilloscope or other measuring device capable of measuring signal integrity. The signal integrity of the received test pattern is compared to an expected signal integrity of a simulation of the test pattern being sent. If the signal integrity is outside of a threshold of the expected signal integrity, then the settings on the HSS transceiver (210) may be adjusted to improve the signal integrity.

Each data unit may be sent as it is generated. In other words, each data unit in the sequence of data units is read from the embedded RAM (212) and sent before the next data unit in the sequence of data units is read from the embedded RAM (212) and sent. For example, a link layer hardware state machine (208) may be configured to send the JT pattern used in testing SAS transceivers. The link layer hardware state machine (208) may load five unique data units into the embedded RAM (212): data_unit_J1, data_unit_J2, data_unit_J3, data_unit_J4, and data_unit_J5.

Continuing with the example, during an idle state, the link layer hardware state machine (208) monitors or waits for a bit in a register on the integrated circuit to be toggled. Once the bit is toggled to indicate that the pattern should begin, the link layer hardware state machine (208) clears a count register and transitions into state_J1.

During state_J1, the link layer hardware state machine (208) sends data_unit_J1 to the HSS transceiver (210) and increments a count. Data_unit_J1 is sent and the count is incremented until the count reaches 41. When the count reaches 41, the link layer hardware state machine (208) clears the count register and transitions into state_J2.

During state_J2, the link layer hardware state machine (208) sends data_unit_J2 to the HSS transceiver (210) one time. The link layer hardware state machine (208) clears the count register and transitions into state_J2.

During state_J3, the link layer hardware state machine (208) sends data_unit_J3 to the HSS transceiver (210) one time. The link layer hardware state machine (208) clears the count register and transitions into state_J4.

During state_J4, the link layer hardware state machine (208) sends data_unit_J4 to the HSS transceiver (210) and increments the count. Data_unit_J4 is sent and the count is incremented until the count reaches 12. When the count reaches 12, the link layer hardware state machine (208) clears the count register and transitions into state_J5.

During state_J5, the link layer hardware state machine (208) sends data_unit_J5 one time. The link layer hardware state machine (208) clears the count register and determines whether a condition is satisfied to return to idle. If the condition is satisfied, the link layer hardware state machine (208) transitions to the idle state. If the condition is not satisfied, the link layer hardware state machine (208) transitions back into state_J1 and restarts generating and sending the test pattern. Each time the test pattern is sent, the HSS transceiver (210) receives the test pattern as the following sequence of data units: data_unit_J1 (41 times), data_unit_J2 (one time), data_unit_J3 (one time), data_unit_J4 (12 times), and data_unit_J5 (one time).

The test pattern may be sent from the HSS transceiver (210) using the link layer hardware state machine (208) without fully bringing up the HSS transmitting device or HSS transceiver (210). Specifically, the test pattern may be generated and sent by the link layer hardware state machine (208) without installing firmware or software that communicates with the link layer hardware state machine (208) or the HSS transceiver (210). The instruction (320) to generate the test pattern may be created (e.g., the register bit may be toggled) using hardware tools directly coupled to the integrated circuit that includes the link layer hardware state machine (208). In this way, the HSS transceiver (210) may be tested early in the overall testing process of the HSS transmitting device, with fewer other elements involved that may cause additional errors.

Figure 4:
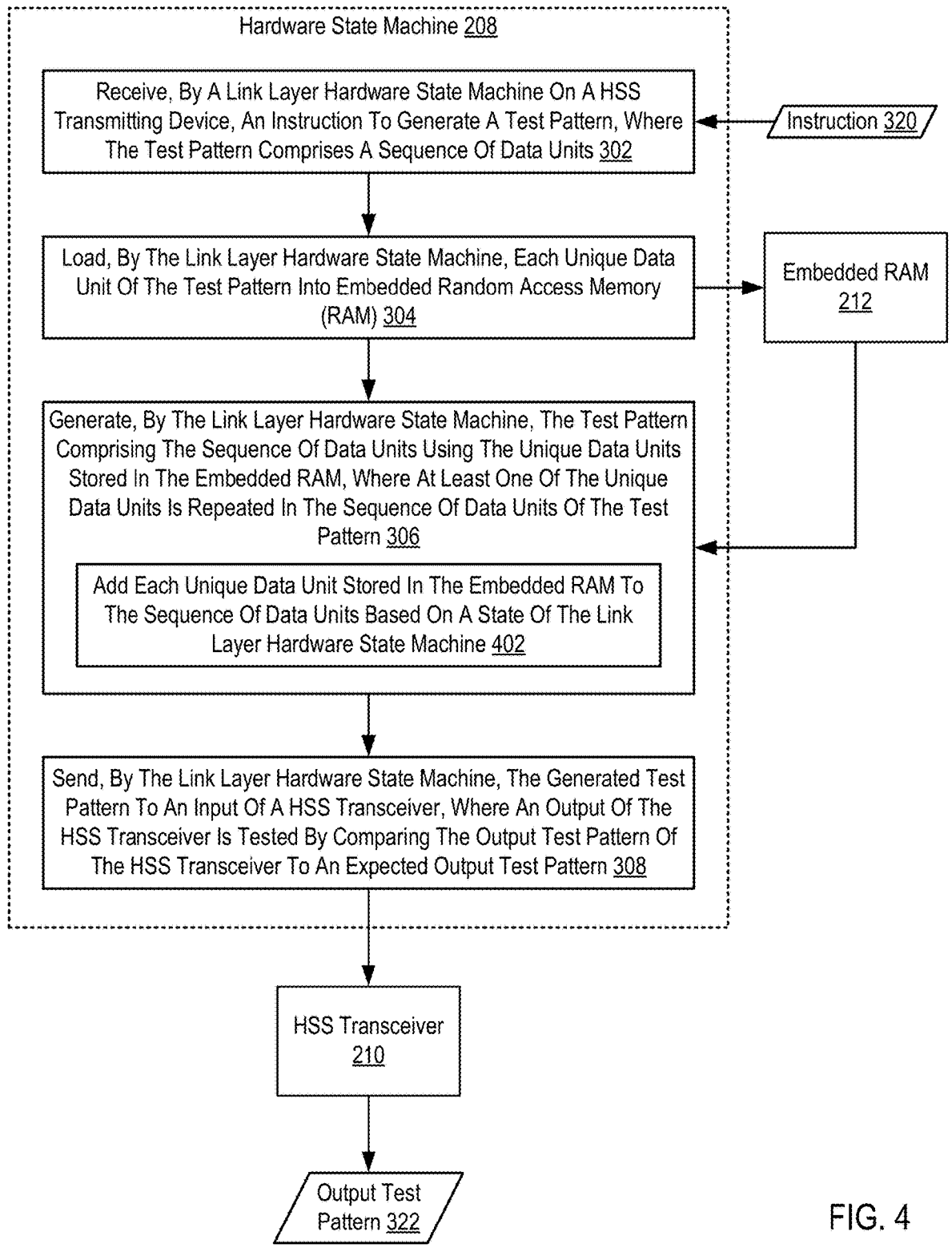
FIG. 4 sets forth a flow chart illustrating an exemplary method for hardware assisted HSS transceiver testing according to embodiments of the present invention.

For further explanation, FIG. 4 sets forth a flow chart illustrating a further exemplary method for hardware assisted high speed serial (HSS) transceiver testing according to embodiments of the present invention that includes receiving (302), by a link layer hardware state machine (208) on a HSS transmitting device, an instruction (320) to generate a test pattern, wherein the test pattern comprises a sequence of data units; loading (304), by the link layer hardware state machine (208), each unique data unit of the test pattern into embedded random access memory (RAM) (212); generating (306), by the link layer hardware state machine (208), the test pattern comprising the sequence of data units using the unique data units stored in the embedded RAM (212), wherein at least one of the unique data units is repeated in the sequence of data units of the test pattern; and sending (308), by the link layer hardware state machine (208), the generated test pattern to an input of a HSS transceiver (210), wherein an output of the HSS transceiver (210) is tested by comparing the output test pattern (322) of the HSS transceiver (210) to an expected output test pattern.

The method of FIG. 4 differs from the method of FIG. 3, however, in that generating (306), by the link layer hardware state machine (208), the test pattern comprising the sequence of data units using the unique data units stored in the embedded RAM (212), wherein at least one of the unique data units is repeated in the sequence of data units of the test pattern includes adding (402) each unique data unit stored in the embedded RAM (212) to the sequence of data units based on a state of the link layer hardware state machine (208). Adding (402) each unique data unit stored in the embedded RAM (212) to the sequence of data units based on a state of the link layer hardware state machine (208) may be carried out by the link layer hardware state machine (208) initiating the transfer of each unique data unit to the HSS transceiver (210) a number of times based on the requirements of the test pattern. The link layer hardware state machine (208) may transition between different states and perform actions based on the current state. The actions may include initiating a transfer of a specified unique data unit to the HSS transceiver (210), incrementing a counter, comparing the counter to a maximum value, and determining whether to exit the state or restart the actions associated with the state.

In view of the explanations set forth above, readers will recognize that the benefits of hardware assisted HSS transceiver testing according to embodiments of the present invention include:

Improving the operation of a computing system by enabling highly accurate testing of HSS transceivers using test patterns directly provided to the HSS transceivers, increasing computing system efficiency.

Improving the operation of a computing system by enabling highly accurate testing of HSS transceivers using preexisting hardware elements, minimizing hardware overhead for HSS transceiver testing and increasing computing system functionality.

Exemplary embodiments of the present invention are described largely in the context of a fully functional computer system for hardware assisted HSS transceiver testing. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of hardware assisted high speed serial (HSS) transceiver testing, the method comprising:
   receiving, by a link layer hardware state machine on a HSS transmitting device, an instruction to generate a test pattern, wherein the test pattern comprises a sequence of data units, wherein the HSS transmitting device comprises the link layer hardware state machine, a HSS transceiver, and embedded random access memory (RAM);
   loading, by the link layer hardware state machine, each unique data unit of the test pattern into the embedded RAM;
   generating, by the link layer hardware state machine, the test pattern comprising the sequence of data units using the unique data units stored in the embedded RAM, wherein at least one of the unique data units is repeated in the sequence of data units of the test pattern; and
   sending, by the link layer hardware state machine of the HSS transmitting device, the generated test pattern to an input of the HSS transceiver of the HSS transmitting device, wherein an output of the HSS transceiver is tested by comparing the output test pattern of the HSS transceiver to an expected output test pattern.

2. The method of claim 1, wherein generating, by the link layer hardware state machine, the test pattern comprising the sequence of data units using the unique data units stored in the embedded RAM comprises adding each unique data unit stored in the embedded RAM to the sequence of data units based on a state of the link layer hardware state machine.

3. The method of claim 1, wherein the HSS transmitting device comprises an integrated circuit comprising the link layer hardware state machine and the HSS transceiver.

4. The method of claim 3, wherein the embedded RAM is link layer handshake data RAM on the integrated circuit.

5. The method of claim 3, wherein receiving the instruction to generate the test pattern comprises detecting that a register on the integrated circuit has been written.

6. The method of claim 1, wherein a size of the generated test pattern is greater than a combined size of the unique data units stored in the embedded RAM.

7. The method of claim 1, wherein the instruction to generate the test pattern comprises a test pattern identifier identifying the test pattern.

8. An integrated circuit for hardware assisted high speed serial (HSS) transceiver testing, wherein the integrated circuit comprises a hardware state machine, and wherein the integrated circuit is configured to carry out the steps of:
   receiving, by a link layer hardware state machine on a HSS transmitting device, an instruction to generate a test pattern, wherein the test pattern comprises a sequence of data units, wherein the HSS transmitting device comprises the link layer hardware state machine, a HSS transceiver, and embedded random access memory (RAM);
   loading, by the link layer hardware state machine, each unique data unit of the test pattern into the embedded RAM;
   generating, by the link layer hardware state machine, the test pattern comprising the sequence of data units using the unique data units stored in the embedded RAM, wherein at least one of the unique data units is repeated in the sequence of data units of the test pattern; and
   sending, by the link layer hardware state machine of the HSS transmitting device, the generated test pattern to an input of the HSS transceiver of the HSS transmitting device, wherein an output of the HSS transceiver is tested by comparing the output test pattern of the HSS transceiver to an expected output test pattern.

9. The integrated circuit of claim 8, wherein generating, by the link layer hardware state machine, the test pattern comprising the sequence of data units using the unique data units stored in the embedded RAM comprises adding each unique data unit stored in the embedded RAM to the sequence of data units based on a state of the link layer hardware state machine.

10. The integrated circuit of claim 8, wherein the HSS transmitting device comprises the integrated circuit, and wherein the integrated circuit comprises the link layer hardware state machine and the HSS transceiver.

11. The integrated circuit of claim 10, wherein the embedded RAM is link layer handshake data RAM on the integrated circuit.

12. The integrated circuit of claim 10, wherein receiving the instruction to generate the test pattern comprises detecting that a register on the integrated circuit has been written.

13. The integrated circuit of claim 8, wherein a size of the generated test pattern is greater than a combined size of the unique data units stored in the embedded RAM.

14. The integrated circuit of claim 8, wherein the instruction to generate the test pattern comprises a test pattern identifier identifying the test pattern.

15. A computer program product for hardware assisted high speed serial (HSS) transceiver testing, the computer program product disposed upon a computer readable storage medium, the computer program product comprising computer program instructions that, when executed, cause an integrated circuit to carry out the steps of:
   receiving, by a link layer hardware state machine on a HSS transmitting device, an instruction to generate a test pattern, wherein the test pattern comprises a sequence of data units, wherein the HSS transmitting device comprises the link layer hardware state machine, a HSS transceiver, and embedded random access memory (RAM);
   loading, by the link layer hardware state machine, each unique data unit of the test pattern into the embedded RAM;
   generating, by the link layer hardware state machine, the test pattern comprising the sequence of data units using the unique data units stored in the embedded RAM, wherein at least one of the unique data units is repeated in the sequence of data units of the test pattern; and
   sending, by the link layer hardware state machine of the HSS transmitting device, the generated test pattern to an input of the HSS transceiver of the HSS transmitting device, wherein an output of the HSS transceiver is tested by comparing the output test pattern of the HSS transceiver to an expected output test pattern.

16. The computer program product of claim 15, wherein generating, by the link layer hardware state machine, the test pattern comprising the sequence of data units using the unique data units stored in the embedded RAM comprises adding each unique data unit stored in the embedded RAM to the sequence of data units based on a state of the link layer hardware state machine.

17. The computer program product of claim 15, wherein the HS S transmitting device comprises the integrated circuit, and wherein the integrated circuit comprises the link layer hardware state machine and the HSS transceiver.

18. The computer program product of claim 17, wherein the embedded RAM is link layer handshake data RAM on the integrated circuit.

19. The computer program product of claim 17, wherein receiving the instruction to generate the test pattern comprises detecting that a register on the integrated circuit has been written.

20. The computer program product of claim 15, wherein a size of the generated test pattern is greater than a combined size of the unique data units stored in the embedded RAM.

* * * * *